US009294117B2

(12) United States Patent
Pullela et al.

(10) Patent No.: US 9,294,117 B2
(45) Date of Patent: Mar. 22, 2016

(54) METHOD AND SYSTEM FOR GAIN CONTROL FOR TIME-INTERLEAVED ANALOG-TO-DIGITAL CONVERTOR (ADC)

(71) Applicant: MaxLinear, Inc., Carlsbad, CA (US)

(72) Inventors: Raja Pullela, Irvine, CA (US); Curtis Ling, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 13/939,595

(22) Filed: Jul. 11, 2013

(65) Prior Publication Data

US 2014/0015703 A1  Jan. 16, 2014

Related U.S. Application Data

(60) Provisional application No. 61/670,578, filed on Jul. 11, 2012, provisional application No. 61/692,004, filed on Aug. 22, 2012.

(51) Int. Cl.
*H03M 1/06* (2006.01)
*H03M 1/50* (2006.01)
*H03M 1/12* (2006.01)
*H03M 1/18* (2006.01)

(52) U.S. Cl.
CPC ........ *H03M 1/50* (2013.01); *H03M 1/12* (2013.01); *H03M 1/185* (2013.01); *H03M 1/1215* (2013.01)

(58) Field of Classification Search
CPC ......... H03M 1/50; H03M 1/185; H03M 1/12; H03M 1/1215
USPC ......................................... 341/117–120, 155
See application file for complete search history.

(56) References Cited

U.S. PATENT DOCUMENTS

| 5,796,358 | A  | * | 8/1998 | Shih et al. ............... 341/139 |
| 6,424,221 | B1 | * | 7/2002 | Korn ...................... 330/282 |
| 6,819,166 | B1 | * | 11/2004 | Choi et al. .............. 327/551 |
| 7,333,153 | B2 |   | 2/2008 | Hartson |
| 7,525,462 | B2 |   | 4/2009 | Parthasarthy |
| 7,937,605 | B2 |   | 5/2011 | Rea |
| 8,123,717 | B2 |   | 2/2012 | Weinert |
| 8,212,697 | B2 |   | 7/2012 | Jansson |
| 2011/0081024 | A1 |   | 4/2011 | Soulodre |
| 2012/0076195 | A1 |   | 3/2012 | Callicotte |

OTHER PUBLICATIONS

PCT, Notification of Transmittal of the International Search Report and the Written Opinion of the International Searching Authority, or the Declaration, in International Application No. PCT/US13/50056, dated Feb. 3, 2014. (21 pages).

* cited by examiner

*Primary Examiner* — Jean B Jeanglaude
(74) *Attorney, Agent, or Firm* — McAndrews, Held & Malloy, Ltd.

(57) ABSTRACT

A system for processing signals may be configured to apply digital conversion to analog signals, and to apply, prior to the analog-to-digital conversion, a gain to at least a portion of the analog signals. The gain may be controlled and/or adjusted based on processing of digital output generated based on the analog-to-digital conversion. The system may comprise a plurality of sampling slices, which may be configured to provide the analog-to-digital conversion in interleaved (e.g., time-interleaved) manner. Each of the sampling slices may comprise a dedicated gain element, for applying gain to signals handled by the corresponding slice. The gain applied by the gain elements of the sampling slices may be controlled, independently, collectively, and/or in based on grouping into subsets. The gain may be controlled based on application of a particular gain control algorithm, which may be selected from a plurality of predefined algorithms.

20 Claims, 5 Drawing Sheets

METHOD AND SYSTEM FOR GAIN CONTROL FOR TIME-INTERLEAVED ANALOG-TO-DIGITAL CONVERTOR (ADC)

CLAIM OF PRIORITY

This patent application makes reference to, claims priority to and claims benefit from:
The U.S. Provisional Patent Application No. 61/670,578, filed on Jul. 11, 2012; and
The U.S. Provisional Patent Application No. 61/692,004, filed on Aug. 22, 2012.

Each of the above stated applications is hereby incorporated herein by reference in its entirety.

TECHNICAL FIELD

Aspects of the present application relate to communications. More specifically, certain implementations of the present disclosure relate to gain control for time-interleaved analog-to-digital convertor (ADC).

BACKGROUND

Existing methods and systems for performing digital-to-analog conversions may be costly, cumbersome and inefficient—e.g., they are complex and/or time consuming, require considerable power, and/or may introduce errors or distortion. Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for gain control for time-interleaved analog-to-digital convertor (ADC), substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

Certain implementations of the invention may be found in method and system for gain control for time-interleaved analog-to-digital convertor (ADC). As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
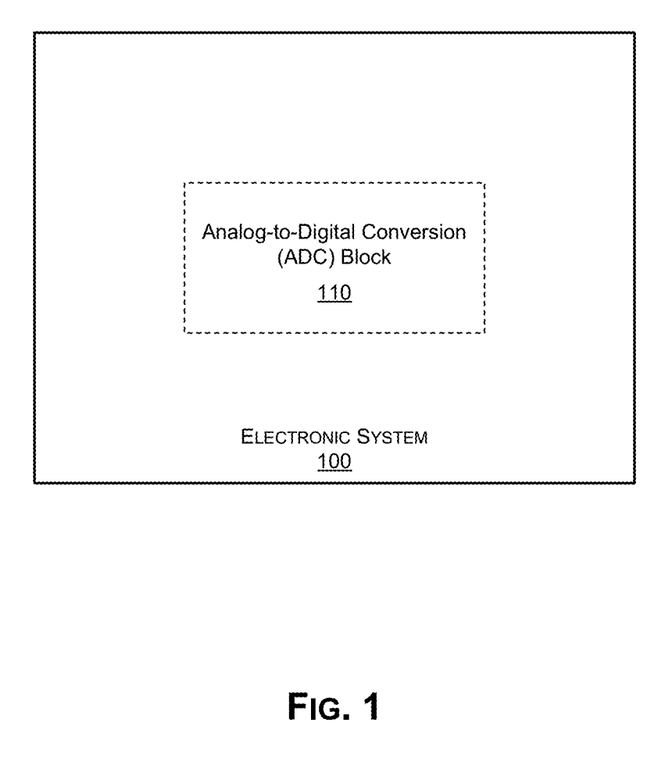
FIG. 1 illustrates an example electronic system that may be operable to perform analog-to-digital conversions.

FIG. 1 illustrates an example electronic system that may be operable to perform analog-to-digital conversions. Referring to FIG. 1, there is shown an electronic system 100.

The electronic system 100 may comprise suitable circuitry, interfaces, logic and/or code for implementing various aspects of the present disclosure. In this regard, the electronic system 100 may be configured to support performing, executing or running various operations, functions, applications and/or services. For example, the electronic system 100 may be used for executing computer programs, playing video and/or audio content, gaming, communication applications or services (e.g., Internet access/browsing, email, text messaging, chatting and/or voice calling services), and/or networking services (e.g., WiFi hotspot, Bluetooth piconet, and/or active 3G/femtocell data channels).

In some instances, the electronic system 100 may be configured to enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted or received signals in accordance with applicable wired or wireless protocols. Examples of wireless protocols or standards that may be supported and/or used by the communication subsystem 250 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne)

and/or 2G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 250 comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to enable or support input/output operations, such as to allow user interactions that may be needed for controlling services provided by the electronic system 100 (e.g., to allow operators to provide input or commands for controlling location specific marketing, or obtain output or feedback pertaining to it). In this regard, the electronic system 100 may comprise components or subsystems for enabling interactions with a user (e.g., end-user or installer), so as to obtain user input and/or to provide user output.

The electronic system 100 may be a stationary system (i.e. being installed at, and/or configured for use only in particular location). In other instances, however, the electronic system 100 may be a mobile device—i.e. intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), personal computers (e.g., laptops or desktops), servers, dedicated multimedia devices (e.g., televisions, game consoles, or portable media players), set-top boxes (STBs) or other similar receiver systems, and the like. The disclosure, however, is not limited to any particular type of electronic system.

In operation, the electronic system 100 may be operable to perform various operations, functions, applications and/or services. In this regard, in some instances, performing the various, operations, functions, application or services supported by the electronic system 100 may entail performing various processing operations on data handled by the electronic system 100. For example, communication of data, whether over wired or wireless interfaces, may typically comprise transmitting and/or receiving analog signals that are communicated over wireless and/or wired connections. In this regard, typically analog radio frequency (RF) signals may be used to carry data (e.g., content), which may be embedded into the analog signals using analog or digital modulation schemes. For analog communications, data is transferred using continuously varying analog signals, and for digital communications, the analog signals are used to transfer discrete messages in accordance with a particular digitalization scheme. Accordingly, handling of digital communications may typically require performing, among other things, digital-to-analog conversion (e.g., via an analog-to-digital conversion (ADC) block 110) at the transmitting end and analog-to-digital conversion at the receiving end. In this regard, analog-to-digital conversion (ADC) block 110 may comprise circuitry, interfaces, logic and/or code for performing analog-to-digital conversions.

In some instances, however, the measures utilized to enhance performance in ADCs may end up causing errors. For example, when gain is applied (e.g., in each ADC slice), the gain may adjust the signals being processed such that the conversions may result in erroneous outcomes (e.g., resulting in digital value '1' when it should have been '0'). Accordingly, in various implementations, gain control may be utilized, to enable adjusting gain being applied to ADC(s), in a manner that may remedy or prevent any errors or distortions resulting from the application of the gain. In this regard, the gain adjustments may be made, for example, dynamically and/or in an adaptive manner. For example, when processing the digital outputs of the ADC component(s), these outputs may be analyzed to identify any errors and/or distortions that may have been introduced because of the gain applied in the ADC slices. The information obtained from such analysis may then be fed back to the ADC slices, for use in adjusting the gain being applied therein based on the identified errors/distortions.

Figure 2:
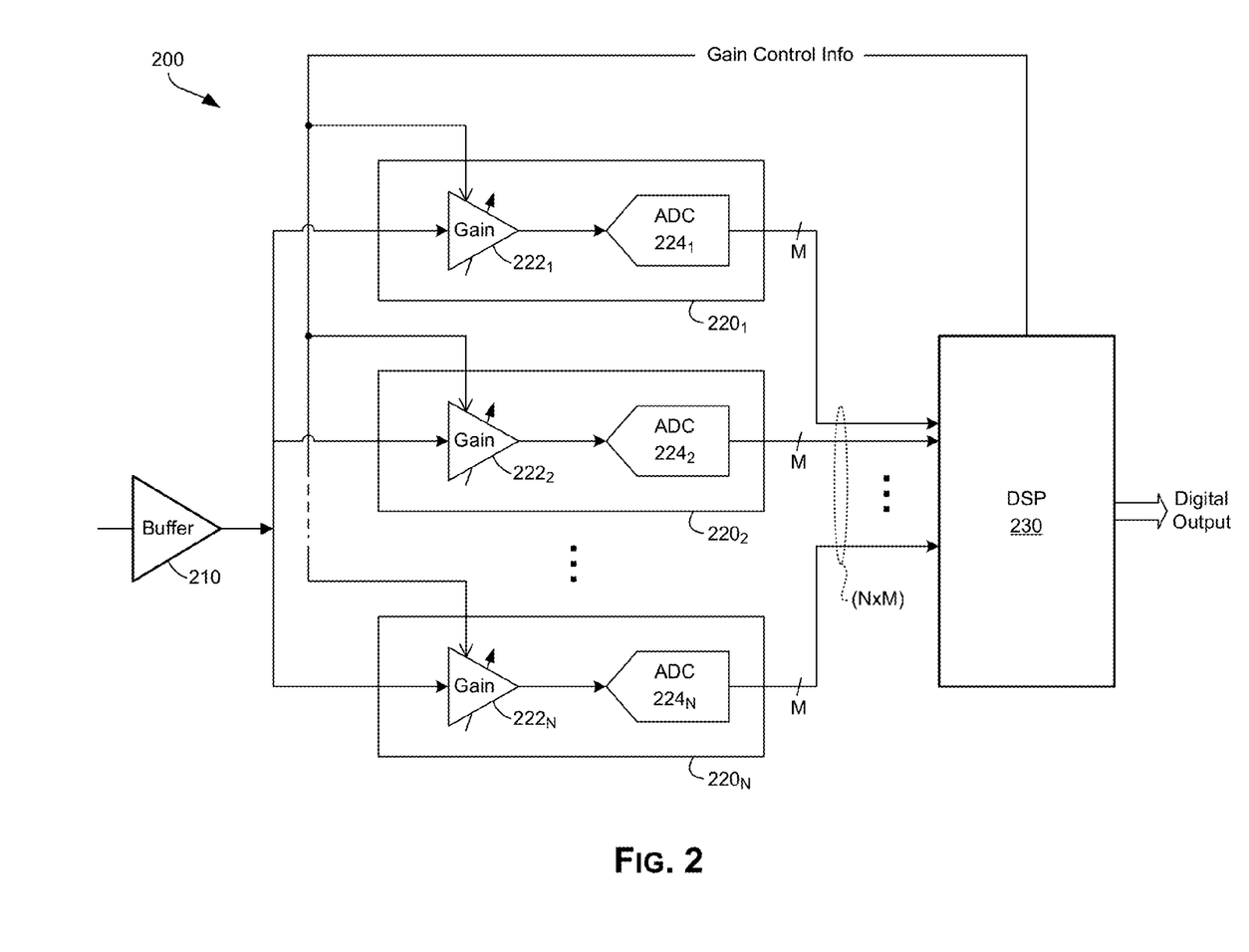
FIG. 2 illustrates an example receiver circuit architecture comprising a time-interleaved analog-to-signal convertor (ADC) with predetermined and/or dynamic gain control.

Accordingly, the gain control (e.g., comprising determining of needed adjustments and/or applying the adjustments) may be performed on per-slice basis—i.e., allowing for gain control/adjusting for individual slices rather than simply controlling/adjusting the gain for all slices simultaneously. Performing the gain control in this manner (on per-slice basis) may result in enhance performance rather than simply adjusting all slices to the same gain value, which may be resemble application of automatic gain control (AGC) to the entire ADC block (i.e., treating the combined ADC operations of all slices as a single ADC, to which AGC is applied uniformly). FIG. 2 describes an example implementation of gain control feedback based architecture of a signal handling chip with an interleaved ADC structure.

In some instances, analog-to-digital conversions (e.g., those performed by the ADC block 110 of the electronic system 100) may be configured such that they may be performed in a time-interleaved manner. In this regard, with interleaved sampling and analog-to-digital conversions, rather than utilizing a single large ADC, a received signal may be sampled and/or subjected to analog-to-digital conversion using multiple smaller sampling/ADC branches or slices. Use of multiple slices may be desirable since it may yield saving in space, circuitry, and/or power consumption. In an example use scenario, the multiple sampling/ADC branches or slices may operate at lower frequencies, with the slices taking turns, for example, to sample the input signal, to provide the overall required sampling for the whole received signal. To further enhance performance, the signals (e.g., portions of the whole input signal or copies thereof) utilized in each of the slices may be adjusted to ensure optimal sampling and/or analog-to-digital conversion in each slice. For example, in some implementations, gain may be applied in each slice (e.g., before the analog-to-digital conversion), to scale the signal (up or down), so that the conversion performed in the slice may be more accurate and/or errors may be prevented or mitigated. Nonetheless, while various implementations are described with respect to applying gain control in interleaved ADC structures (e.g., comprising plurality of ADC slices/branches, configured to operate in time-interleaved manner), the disclosure is not so limited, however. Accordingly, a similar approach may be applied (e.g., applying gain, with feedback based control thereof) in other architectures—e.g., in single ADC based implementations.

Also, while gain control may be described as being feedback based schemes—i.e. with the gain control being performed based on feedback data obtained from post-ADC processing components/operations (e.g., DSP processors/operations), the disclosure is not so limited. For example, in some implementations, at least some of the gain control related operations may be performed in the ADCs/slices themselves, rather than relying on control signals from post processing block(s). For example, each ADC/slice may incorporate a detection function (e.g., in the form of simple analog circuit/block), which may be configured to detect errors (e.g., clipping) that may be addressed by adjusting the gain, and may then determine the appropriate gain adjustment for the corresponding slice. The analog detection circuit/block may then send gain related data (e.g., clipping related information and/or resulting gain status/adjustment for the slice) back to the digital domain components of the slice, for post processing.

FIG. 2 illustrates an example time-interleaved analog-to-signal convertor (ADC) architecture with predetermined and/or dynamic gain control. Referring to FIG. 2 there is shown a signal receiver 200.

The signal receiver 200 may comprise suitable circuitry, interfaces, logic and/or code for handling and/or performing signal reception (e.g., of radio frequency, or RF, signals) and/or processing operations related thereto. In this regard, the signal receiver 200 may be configured to provide various reception and/or processing related operations and/or functions, comprising, e.g., receiving analog (RF) signals, such as via antennas or wired-based connectors, amplification, sampling and analog-to-digital conversions (if needed), and at least some signal processing (e.g., baseband/passband processing and/or digital signal processing). In some instances, the signal receiver 200 may be implemented based on a single-chip receiver architecture, in which the entire receiving path (or substantial portion thereof) may be integrated onto a single chip, which may be configured to directly perform the various reception and/or processing related operations and/or functions associated with the signal receiver 200.

As mentioned, in some instances handling received signals (by the signal receiver 200) may comprise sampling and analog-to-digital conversion processing. In this regard, the received signal may comprise analog signals (e.g., RF signals), carrying data which may be embedded using particular modulation scheme. For example, when the received (analog) signals comprise digitally modulated communication, the signal receiver 200 may be operable to perform analog-to-digital conversions, to enable the generation of digital signals based on sampling of the analog (e.g., RF) signals, in which a sequence of samples—that is a sequence of discrete-time information—may be determined and/or generated based on the received analog signals. The signal sampling may be achieved by reading the value of continuous input analog signals at certain, periodic intervals as determined by, for example, a particular (e.g., predefined) sampling rate.

In an example implementation, the signal receiver 200 may be implemented or configured to provide analog-to-digital conversion processing in a time-interleaved manner. In this regard, with interleaved sampling and analog-to-digital conversion, a signal (typically very wideband—e.g., 1 GHz or more) may be received and digitized (i.e. sampled and/or subjected to analog-to-digital conversion) using multiple analog-to-digital convertors (ADCs). The sampling may be performed via the multiple ADC branches or slices, at lower frequencies, with the ADCs taking turns, for example, to sample the input signal, to provide the overall required sampling for the whole received signal.

For example, the signal receiver 200 may comprise a single input buffer 210, a plurality of sampling slices $220_1$-$220_N$ ('N' being a positive integer), and a digital signal processor (DSP) 230. In this regard, the signal receiver 200 may be configured to perform the sampling and analog-to-digital conversion via the plurality of slices $220_1$-$220_N$ (e.g., in time-interleaved manner).

The buffer 210 may comprise suitable circuitry, interfaces, logic and/or code operable to buffer and transfer signals from a component/circuit coupled to its input port to component(s)/circuit(s) coupled to its output port. For example, the buffer 210 may be used in controlling inputting of the analog (RF) input into the slices $220_1$-$220_N$. In this regard, use of the buffer 210 may allow blocking undesired effects (e.g., loading), to the input connected components, by the output connected components. The buffer 210 may be implemented as a unity-gain buffer—that is having no gain, so that signals transferred through the buffer 210 may be transferred unchanged.

Each of the slices $220_1$-$220_N$ may comprise suitable circuitry, interfaces, logic and/or code that may be operable to perform sampling and/or analog-to-digital conversion. In this regard, use of the plurality of the slices $220_1$-$220_N$ may enable performing sampling and analog-to-digital conversion in a time-interleaved manner. For example, each of the slices $220_1$-$220_N$ may comprise a corresponding analog-to-digital converter (ADC) $224_i$. In this regard, each of the ADCs $224_1$-$224_N$ may comprise suitable circuitry, interfaces, logic and/or code operable to convert analog samples to corresponding digital codes. In some instances, each of ADCs $224_1$-$224_N$ may comprise a plurality (e.g., M, with 'M' being a positive integer) of sub-ADC modules or blocks, with each sub-ADC being configured to generate a single digital code (e.g., symbol or bit), thus allowing for parallel conversion of multiple symbols within each of the ADCs $224_1$-$224_N$. Accordingly, the signal receiver 200 may be configured to utilize, in parallel for example, multiple sampling and digitization paths. Thus, the signal receiver 200 may be configured to utilize N×M distinct and parallel sampling/digitizing paths. The invention need not be implemented in this manner, however.

In an example implementation, each of the slices $220_1$-$220_N$ may comprise a corresponding gain element $222_i$. In this regard, each of the gain elements $222_1$-$222_N$ may comprise suitable circuitry, interfaces, logic and/or code operable to amplifying an input signal, such as by applying a particular gain factor. The gain elements $222_1$-$222_N$ may be implemented as, for example, low-noise amplifiers (LNAs). In some instances the gain factors applied via each (or in subsets of) the gain elements $222_1$-$222_N$ may vary.

The DSP 230 may comprise suitable circuitry, interfaces, logic and/or code operable to perform computationally intensive processing of data during communication operations. In particular, the DSP 230 may be configured to provide digital signal processing operations and/or functions. The DSP 230 may be operable to, for example, encode, decode, modulate, demodulate, encrypt, decrypt, scramble, descramble, and/or otherwise process data that may be carried in transmitted or received signals. In some instances, the DSP 230 may also be configured to select, apply, and/or adjust a modulation scheme, error coding scheme, and/or data rates based on type and/or characteristics of interface being used in communicating the signals (carrying the data).

In operation, the signal receiver 200 may be configured to provide predetermined and/or dynamic/predictive gain control for the ADC slices incorporated therein. In this regard, rather than having each of the gain elements $222_1$-$222_N$ apply fixed and/or uniform gain, the gain elements $222_1$-$222_N$ may be controlled, individually and/or in subsets, to apply different gain. In other words, the gain in each or in subgroups of the gain elements $222_1$-$222_N$ may be controlled independently. For example, the gain applied in each and/or in groups of the gain elements $222_1$-$222_N$ may be modified, so as to increase or decrease that gain. In an embodiment of the invention, the gain applied via the gain elements $222_1$-$222_N$ may be controlled based on feedback within the signal receiver 200, such as using characteristics of outputs of the ADC $224_1$-$224_N$. For example, after completing digitization and/or other signal processing (e.g., via the DSP 230), the gain scaling can be accounted for by post correction (i.e. scale the signal back up in the digital domain). In this regard, there may be, for example, an extra one or more bits in the digital signal that gives more headroom to scale the signal up). Thus, the DSP 230 may be configured to generate gain control information, which may specify particular gain adjustment for particular ones or subgroups of the gain elements $222_1$-$222_N$, which may be applied as feedback to adjust or modify gain applied to input signals that are subsequently fed into the ADC $224_1$-$224_N$.

In various implementations, one or more algorithms may be selected and/or applied when determining gain adjustments that are used in modifying the gain elements $222_1$-$222_N$. For example, the gain control algorithm may be configured such that when the sample output of a particular slice (e.g., slice $220_1$) clips, the gain applied to the gain elements in one or more of the remaining slices (slices $220_2$-$220_N$), may be scaled down. The gain control algorithm may also be configured such that it detects the slope of the signal from multiple samples, and uses that slope to predict when clipping will occur. The predictive information may then be used to preemptively scale down the gain of the particular slices (one or more of the slices $220_1$-$220_N$) that may be predicted to clip.

The gain control algorithm may also be configured such that instead of trying to predict which particular slices will clip, it just scales down a predetermined and/or randomly or pseudo-randomly determined subset(s) of the gain elements $222_1$-$222_N$. In this regard, such an approach may guarantee getting sufficient non-clipped samples, to enable reconstructing clipped samples, such as via interpolation. Determining which of the gain elements $222_1$-$222_N$ to scale (down or up) may be done, for example, randomly or pseudo-randomly (and may randomly or pseudo-randomly change over time), or it (determining the scaled gain elements) may be based on the type of signal(s) being digitized and/or the signal(s) characteristics, as determined via the DSP 230 for example.

In some instances, one or more slices may be completely shut off, under particular signal conditions, so as to lower the power dissipation. For example, when power need to be saved, half the number of slices may be shut off (e.g., by shutting off every other slice, or by shutting off odd or even numbered slices). Alternatively, the number of slices (and the selection of which slice) to be shut off may be determined using a preconfigured algorithm, which may continuously pick (e.g., using a random number generator) the slices to be shut off. In this regard, the randomization provided in this manner may help in lowering the alias energy that may leaks in to band(s) of interest from any one frequency band within the Nyquist band of the ADC.

In an implementation, the signal receiver 200 may be configured to support predictive based adjustments and/or control of particular facets of the signal processing, including various aspects of any analog-to-digital conversion that may be performed (e.g., to support predictive gain control during analog-to-digital conversions). For example, the predictive based adjustments and/or control (e.g., gain applied to ADC slices) may be based on information pertaining to particular signals that may be received by the signal receiver 200. The information may be obtained or extracted, for example, from the signals themselves; obtained from or based on previously stored data (e.g., configuration data for use in conjunction with particular types of communications, protocols and/or interfaces); and/or may be received from other systems—e.g., from transmitting-side (i.e. the device or system transmitting the signals).

For example, in wideband systems, dynamic range may often be limited by one or more dominant narrowband interferers or blockers. In this regard, knowledge of particular characteristics or attributes of the interferers or blockers (e.g., portions of the spectrum where dominant interferers or blockers may exist, and/or knowledge regarding behavior of any such interferes) may enable predicting when and/or how particular types of errors or distortions may occur during signal processing (including during analog-to-digital conversion). For instance, when a wide spectrum that is fully subject to reception processing (including sampling and digitizing) is dominated by one or more narrowband blockers, predicting how these signals (blockers) may behave may be improved, even where these blockers are oversampled, when these blockers reside in known position(s), with known statics or behavior relative to the sampling rate. Thus the sampling process may be adjusted in a predictable manner based on that knowledge. For example, in an interleaved ADC system (e.g., comprising a plurality of time-interleaved ADC-based slices, such as the slices $220_2$-$220_N$), the sampling process performed by the slices may be adjusted (e.g., scaled up or scaled down) in a predictable manner based on the knowledge of the positions and/or timing of the blockers. Thus, where interferers or blockers are narrowband, it may be possible to predict when clipping may occur (e.g., during analog-to-digital conversion), and/or what its behavior may be, based on knowledge of the portion(s) of the spectrum where the dominant interferers or blockers may reside.

In some instances, the clipping related information (location and/or behavior) obtained in this manner may be utilized in setting and/or adjusting gain control on particular slice(s) in the interleaved ADC based system only when needed rather than using other, less efficient mechanisms or techniques (e.g., statistical methods) that are applied in determining any such gain adjustment, without that knowledge. For example, a single LTE blocker with a 5 MHz bandwidth located at 700 MHz may have a known envelope which may not vary faster than 5 MHz, and whose carrier is located at 700 MHz. The known information about a known envelope of such an LTE block may be utilized in predicting the envelope trajectory by, for example, putting previous blocker signal envelope points through a band-limited filter to predict what the signal(s) may do at future sample points, and that information may subsequently be used to control gain of corresponding and/or specific slices in the interleaved ADC system. In some instances, certain stochastic techniques, such as hidden Markov models, may be used to model the blocker(s) and predict when the blocker(s) may be likely to cause clipping.

In an example implementation, gain and/or phase (or delay) correction (if any) may be applied as part of gain control (or adjustment) of one or more slices (e.g., one or more of the slices $220_2$-$220_N$) of an interleaved ADC based topology (e.g., the signal receiver 200). In this regard, the gain control introduced to a given slice ($220_i$) may have errors in the gain applied, which may introduce distortion in the signal being digitized. Accordingly, digital gain and/or phase correction may be applied to affected slices in order to minimize any such distortion. In some instances, repeated applications of erroneous gain(s) and/or erroneous phase(s) in the interleaved ADC system may introduce distortion of the signals being digitized (e.g. harmonic distortion, distortion at harmonics of the sampling frequency, etc.). Thus, to correct such errors, distortion may be measured for each of the interleaved slices, (e.g. in the digital domain, by configuring the DSP 230, for example, to perform spectral analysis and/or correlation techniques, such as blind source separation), and the gain and/or phase (or delay) of the corresponding slice(s) may be compensated. In this regard, the compensation may be done in the analog and/or the digital domain, to minimize distortion of the affected slice(s). In some instances, correction values may be stored (e.g., in memory), to enable future use, for example, allowing more rapid convergence of the compensation algorithm.

For example, in some instances values of gain (steps) selected for and/or applied in the interleaved ADC system may be estimated, such as based on predictive analysis, rather than being determined precisely. Thus, in instances where the initially estimated gain values (or steps) for particular slice(s) may differ (even by small margins—e.g., by 0.1 dB or less) from the actually required gain (i.e. the gain that 'should have been' applied), some errors and/or distortion may be introduced as a result. Accordingly, to further enhance gain in the interleaved ADC system, gain calibration may be performed to remove and/or prevent errors or distortions resulting from inaccurate gain selection. In this regard, the outcome of ADC processing (as a whole and/or for one or more slices) may be analyzed (e.g., in the digital domain), to determine presence of any errors or distortions, and necessary adjustments or tweaks to the applied gain (values) may be determined based on that analysis, such as to remove or correct the errors or distortions. The gain calibration may be performed continuously (on the fly, as part of the overall ADC processing) and/or only periodically. Furthermore, the gain calibration may be performed separately on each slice. In some instances, however, gain calibration may be performed on a group of slices, such as when these slices apply the same gain.

Figure 3:
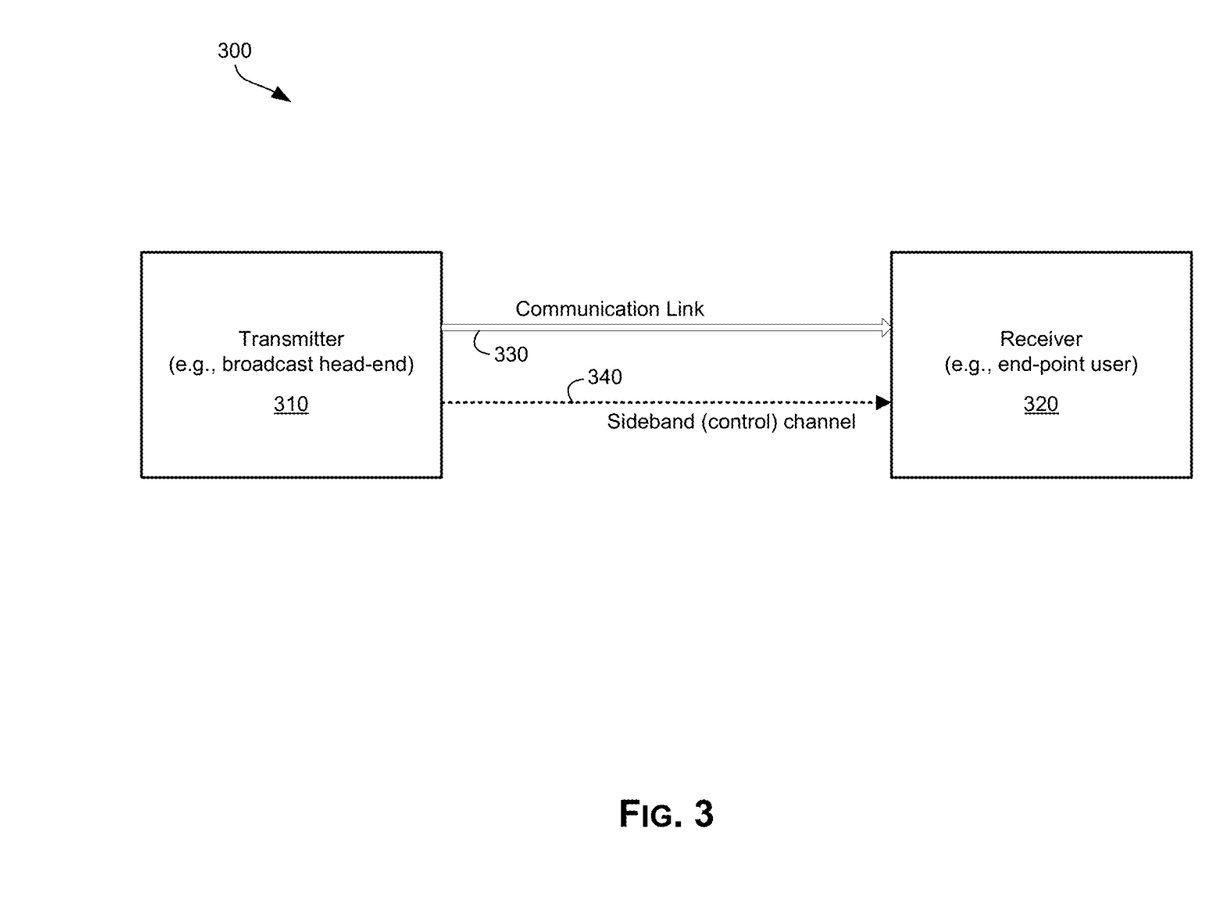
FIG. 3 illustrates an example communication setup for utilizing a sideband low-rate channel, between a transmitter and a receiver, to exchange control data, including information relating to adjusting gain control during analog-to-signal conversion.

FIG. 3 illustrates an example communication setup for utilizing a sideband low-rate channel, between a transmitter and a receiver, to exchange control data, including information relating to adjusting gain control during analog-to-signal conversion. Referring to FIG. 3, there is shown a communication system 300, comprising a transmitter 310 and a receiver 320.

Each of the transmitter 310 and the receiver 320 may comprise suitable circuitry, interfaces, logic and/or code for enabling and/or supporting communications in accordance with various aspects of the present disclosure. In this regard, each of the transmitter 310 and the receiver 320 may support communication over wired and/or wireless connections. For example, each of the transmitter 310 and the receiver 320 may be configured to support use of a plurality of wired and/or wireless interfaces and/or protocols, and may be operable to perform necessary processing operations to facilitate transmission and/or reception of signals (e.g., RF signals) over supported wired and/or wireless interfaces. The receiver 320 may comprise, for example, a signal reception component 322, which may, for example, be substantially similar to the signal receiver 200 of FIG. 2, which may be utilized in providing the necessary signal reception handling and/or processing operations/functions to facilitate processing of signals thereby. Examples of wireless protocols or standards that may be supported and/or used by the transmitter 310 and/or the receiver 320 may comprise near field communication (NFC) protocols; wireless personal area network (WPAN) protocols, such as Bluetooth (IEEE 802.15); wireless local area network (WLAN) protocols, such as WiFi (IEEE 802.11); cellular standards, such as 2G/2G+ (e.g., GSM/ GPRS/EDGE) and/or 3G/3G+ (e.g., CDMA2000, UMTS, HSPA); 4G standards, such as WiMAX (IEEE 802.16) and/or LTE; Ultra-Wideband (UWB); and/or wireless TV/broadband (access) standards, such as terrestrial and/or satellite TV standards (e.g., DVB-T/T2, DVB-S/S2). Examples of wired protocols and/or interfaces that may be supported and/or used by the transmitter 310 and/or the receiver 320 may comprise Ethernet (IEEE 802.3), Fiber Distributed Data Interface (FDDI), Integrated Services Digital Network (ISDN); and/or wired based TV/broadband (access) standards, such as Digital Subscriber Line (DSL), Data Over Cable Service Interface Specification (DOCSIS), Multimedia over Coax Alliance (MoCA).

In operation, the transmitter 310 and the receiver 320 may be operable to establish communication links therebetween, and/or to communicate signals via these links, such as to enable exchange of data. For example, the transmitter 310 and the receiver 320 may establish a communication link 330, which may be utilized in enabling transmission of signals (e.g., RF signals) from the transmitter 310 to the receiver 320. The communicated signals may be communicated (in the communication link 330) over supported wired and/or wireless interfaces. Furthermore, the transmitter 310 and the receiver 320 may be configured to perform necessary signal processing operations to facilitate the required transmission and reception of signals during communications via the communication link 330.

The signals transmitted by the transmitter 310 (and received by the receiver 320) via the communication link 330 may, for example, carry data requested by or pertaining to applications running in the receiver 320. For example, the transmitter 310 may correspond to a broadcast head-end node (e.g., a CATV head-end or a satellite head-end), and the receiver 320 may correspond to end-point user node (e.g., CATV/satellite TV receiver or set-top box), with the signals communicated over the communicate link 330 (which may correspond to wired/CATV connection or wireless/satellite downlink feed) being utilized in carrying TV (or other media) content.

The signals communicated between the transmitter 310 and the receiver 320 may comprise analog signals, in which the communicated data may be embedded using analog or digital modulation schemes. In this regard, during analog communications, data may be transferred used continuously varying analog signals, and during digital communications, the analog signals are used to transfer discrete messages in accordance with a particular digitalization scheme. Accordingly, during performance of digital communications, the signal processing operations performed by the transmitter 310 and the receiver 320 may comprise, among other things, digital-to-analog conversions on the transmitter-side and analog-to-digital conversions on the receiver-side. For example, the signal reception component 322 may be configured to provide digital-to-analog conversions substantially in a similar manner as described with respect signal receiver 200 of FIG. 2 (e.g., comprising use of gain controlled time-interleaved based sampling/analog-to-digital conversions). In some implementations, the transmitter 310 and the receiver 320 may establish a sideband, low bitrate channel 340, which may be utilized in exchanging control information, such as information relating to the communication link 330 and/or data communicated thereby.

In an example implementation, the transmitter 310 may be able to predict and/or determine when particular errors or distortions may occur when processing signals transmitted from the transmitter 310. The transmitter 310 may be configured to determine, for example, when clipping may occur during analog-to-digital conversions in the receiver 320. For example, the setup comprising the transmitter 310 and the receiver 320 may be a DOCSIS based setup. In this regard, in DOCSIS systems, a single broadband source (the cable modem termination system or CMTS), which may correspond to the transmitter 310, may be configured to generate next-generation OFDM signals for downstream. The CMTS (i.e. the transmitter 310) may be able to predict precisely when peaks will occur. In some instances, such peaks may be suppressed by various techniques, including the provisioning of spare tones in the OFDM spectrum to be used to mitigate the peak. However, such approach may incur an undesired overhead.

Accordingly, information determined or obtained at the transmitter-side (e.g., when peaks will be occurring), which may relate to and/or enable determining when errors or distortions may occur during processing at the receiver-side (e.g., when clipping may occur during analog-to-digital conversions) may be transmitted. In this regard, the information may be communicated separate from the main data traffic (transmitted via communication link 330), such as using the sideband channel 340. The use of low bitrate channels such as the sideband channel 340 may be desirable, since such issues (e.g., peaks) may arise infrequently. The receiver 320 may demodulate the sideband channel 340, and the information communicated therein may be extracted, and used thereafter in controlling and/or adjusting processing operations, such as in controlling (or adjusting) gain applied during analog-to-digital conversions.

Figure 4:
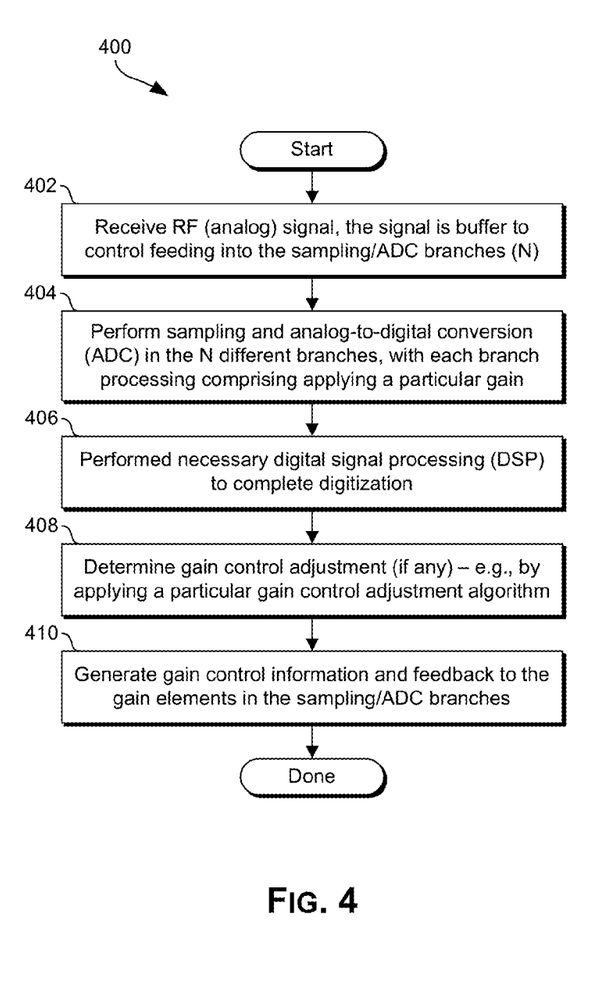
FIG. 4 is a flow chart that illustrates example process for gain control of time-interleaved analog-to-signal convertor (ADC) processing.

FIG. 4 is a flow chart that illustrates an example process for gain control of time-interleaved analog-to-signal convertor (ADC) processing. Referring to FIG. 4, there is shown a flow chart 400 comprising a plurality of example steps, which may be performed in a system (e.g., the ADC 200) for enabling use of dynamic gain control during time-interleaved analog-to-digital conversions.

In step 402, an analog (e.g., RF) signal comprising digital information modulated therein may be received. The received analog signal may be buffered (e.g., via the buffer 210), such as to enable controlling feeding the signals (or portions thereof) into a plurality of sampling/analog-to-digital conversion branches (e.g., the slices $220_1$-$220_N$). In step 404, sampling and analog-to-digital conversion may be performed via the multiple branches (the slices $220_1$-$220_N$). In this regard, in some instances the processing performed in each branch may comprise, in addition to the analog-to-digital conversions (e.g., via the ADC $224_1$-$224_N$), applying (e.g., prior to the actual sampling/conversion) a particular gain (e.g., via the gain elements $222_1$-$222_N$). In step 406, digital signal processing may be performed (e.g., via DSP 130) to the samples/discrete data generated after completion of the analog-to-digital conversions, to complete digitization of the received analog signal. In some instances, the digital signal processing may comprise applying post-correction to compensate for adjustments to the gain elements $222_1$-$222_N$.

In step 408, gain control adjustments (if any), which may be applied to sampling/analog-to-digital conversion branches (e.g., via the gain elements $222_1$-$222_N$) may be determined. In this regard, determining the gain adjustments may be performed by applying a particular gain control adjustment algorithm, as describe with respect to FIG. 1 for example. Furthermore, in some instances, the gain adjustment determination may also depend on information received from the transmitter-side (e.g., via sideband channels). In step 410, the gain adjustments may be applied. In this regard, once the gain adjustments are determined, gain control information may be generated and provided as feedback (signal(s)) to the gain elements ($222_1$-$222_N$) in the sampling/ADC branches (the slices $220_1$-$220_N$), to modify gain applied in these branches in subsequent operations.

Figure 5:
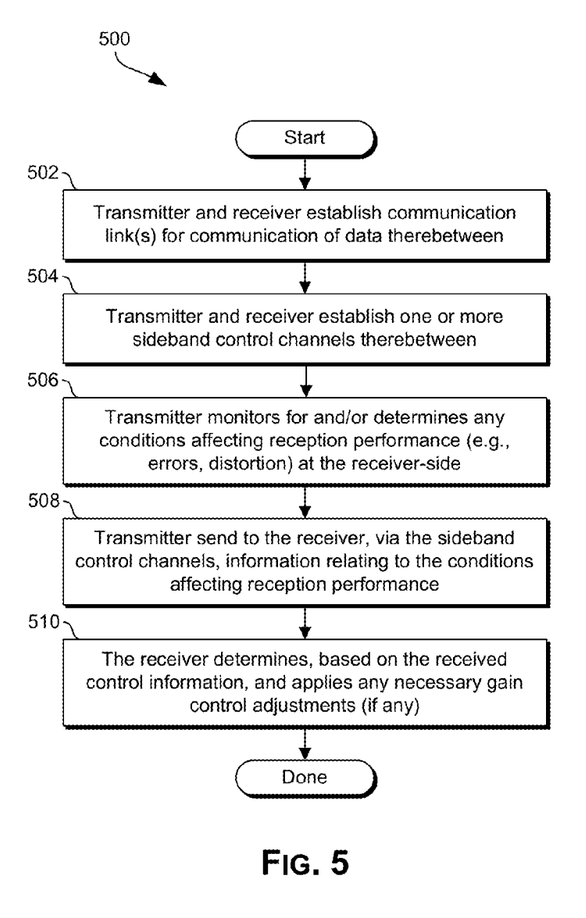
FIG. 5 is a flow chart that illustrates an example process for controlling gain control of time-interleaved analog-to-signal convertor (ADC) processing based on control information exchanged via sideband channels.

FIG. 5 is a flow chart that illustrates an example process for controlling gain control of time-interleaved analog-to-signal convertor (ADC) processing based on control information exchanged via sideband channels. Referring to FIG. 5, there is shown a flow chart 500 comprising a plurality of example steps, which may be performed in system (e.g., the communication setup 300) for enabling use of predictive gain control during time-interleaved analog-to-digital conversions at receiver-side based on transmitter-side data.

In step 502, a transmitter (e.g., the transmitter 310) and a receiver (e.g., the receiver 320) may establish communication link(s) for communication of data therebetween (e.g., the communication link 330). In step 504, the transmitter and the receiver may setup one or more sideband, low bitrate control channels therebetween (e.g., the sideband channel 340). In this regard, the sideband channels may be utilized only when there is control related information that need to be communicated between the peers (i.e., these channels may be setup for infrequent use). In step 506, the transmitter may monitor for and/or determine occurrence of any conditions that may affect reception performance (e.g., errors, distortion) at the receiver. For example, the transmitter may monitor behavior and/or characteristics of narrowband interferers or blockers, such as for peaks.

In step 508, the transmitter may send to the receiver, via the sideband control channels, information (if any, which may have been obtained by the transmitter) relating to the conditions affecting reception performance. In step 510, the receiver may determine and apply any necessary adjustments (if any) to the reception operations/functions, based on the received control information. For example, the receiver may determine necessary gain control adjustment applicable to sampling/analog-to-digital conversions (e.g., as described with respect to steps 408 and 410 of FIG. 4).

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for gain control for time-interleaved analog-to-digital convertor (ADC).

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A method, comprising:
   in an electronic system:
   processing an analog signal, wherein the processing comprises:
   performing analog-to-digital conversion of the analog signal; and
   applying, prior to the analog-to-digital conversion, gain to at least a portion of the analog signal; and
   controlling the gain based on processing of a digital output generated based on the analog-to-digital conversion.

2. The method of claim 1, comprising configuring the analog-to-digital conversion to function in an interleaved manner.

3. The method of claim 1, comprising applying the analog-to-digital conversion via a plurality of slices, configured such that the combined operation of the plurality of slices provides overall analog-to-digital conversion of the analog signal.

4. The method of claim 3, comprising applying separate gain in each of the plurality of the slices.

5. The method of claim 4, comprising controlling the application of the separate gain in each of the plurality of the slices independently, collectively, and/or in based on grouping into subsets.

6. The method of claim 1, comprising controlling the gain based on a particular gain control algorithm, selected from a plurality of predefined control algorithms.

7. The method of claim 6, wherein the plurality of predefined control algorithms comprises:
   a first algorithm by which remaining slices in a multi-slice analog-to-digital convertor (ADC) based implementation are adjusted based on adjustment to one slice and/or error detected corresponding to conversion or sampling performed via the one slice;
   a second algorithm by which slices in a multi-slice analog-to-digial convertor (ADC) based implementation are adjusted in predictive manner based on analysis of the sloping of the resultant signals corresponding to at least one of the slices, when sloping is indicative of occurrence of clipping; and
   a third algorithm configured such that at least some of gains corresponding to some of slices in a multi-slice analog-to-digital convertor (ADC) based implementation are adjusted in a predetermined and/or a random manner to ensure that occurrence of clipping is prevented.

8. A system, comprising:
   one or more circuits for use in a signal processing component, the signal processing component being configured to perform a plurality of processing operations, comprising analog-to-digital conversion, the one or more circuits being operable to:
   apply analog-to-digital conversion to a received analog signal;
   apply, prior to the analog-to-digital conversion, gain to at least a portion of the analog signal; and
   control the gain based on processing of a digital output generated based on the analog-to-digital conversion.

9. The system of claim 8, wherein the analog-to-digital conversion is configured to function in an interleaved manner.

10. The system of claim 8, wherein the one or more circuits are operable to apply the analog-to-digital conversion via a plurality of slices, such that the combined operation of the plurality of slices provides overall analog-to-digital conversion of the analog signal.

11. The system of claim 10, wherein the one or more circuits are operable to apply separate gain in each of the plurality of the slices.

12. The system of claim 11, wherein the one or more circuits are operable to control the application of the separate gain in each of the plurality of the slices independently, collectively, and/or in based on grouping into subsets.

13. The system of claim 8, wherein the one or more circuits are operable to control the gain based on a particular gain control algorithm, selected from a plurality of predefined control algorithms.

14. The system of claim 13, wherein the plurality of predefined control algorithms comprises:
    a first algorithm by which remaining slices in a multi-slice analog-to-digital convertor (ADC) based implementation are adjusted based on adjustment to one slice and/or error detected corresponding to conversion or sampling performed via the one slice;
    a second algorithm by which slices in a multi-slice analog-to-digital convertor (ADC) based implementation are adjusted in predictive manner based on analysis of the sloping of the resultant signals corresponding to at least one of the slices, when sloping is indicative of occurrence of clipping; and
    a third algorithm configured such that at least some of gains corresponding to some of slices in a multi-slice analog-to-digital convertor (ADC) based implementation are adjusted in predetermined and/or random manner to ensure that occurrence of clipping is prevented.

15. A system, comprising:
    a signal processing component that is configured to perform a plurality of processing operations, the signal processing component comprising:
    a plurality of sampling slices, for use in generating a digital output based on an analog signal, wherein each sampling slice comprises:
    an analog-to-digital converter (ADC) element, for applying analog-to-digital conversion to at least a portion of the received analog signal; and
    a gain element, for applying within a corresponding sampling slice and prior to application of analog-to-digital conversion via the ADC element, gain to at least the portion of the analog signal; and
    a processing circuit for processing the digital output, wherein the processing circuit is operable to generate gain related information, for use in controlling gain applied via gain elements corresponding to the plurality of sampling slices.

16. The system of claim 15, wherein the signal processing component comprises a buffering circuit, for buffering the analog signal before inputting the plurality of slices.

17. The system of claim 15, wherein the plurality of sampling slices is configured to perform overall analog-to-digital conversion of the analog signal in time-interleaved manner.

18. The system of claim 15, wherein the signal processing component is incorporated into a receiving device, with the analog signal being received from a corresponding transmitting device.

19. The system of claim 18, wherein the receiving device is operable to setup with the corresponding transmitting device, one or more sideband channels for exchanging control related data.

20. The system of claim 19, wherein the receiving device is operable to receive from the corresponding transmitting device, via the one or more sideband channels, gain control related data that is utilized by the signal processing component in controlling gain applied in the plurality of sampling slices.

\* \* \* \* \*